US010069476B2

(12) United States Patent
Hara et al.

(10) Patent No.: US 10,069,476 B2
(45) Date of Patent: Sep. 4, 2018

(54) MULTIPLEXER AND MODULE

(71) Applicant: TAIYO YUDEN CO., LTD., Tokyo (JP)

(72) Inventors: Hiroshi Hara, Tokyo (JP); Yasuhisa Okamoto, Tokyo (JP); Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 36 days.

(21) Appl. No.: 15/168,554

(22) Filed: May 31, 2016

(65) Prior Publication Data

US 2017/0063337 A1 Mar. 2, 2017

(30) Foreign Application Priority Data

Sep. 2, 2015 (JP) .................................. 2015-173245

(51) Int. Cl.
*H03H 9/70* (2006.01)
*H03H 9/64* (2006.01)
(Continued)

(52) U.S. Cl.
CPC ........ *H03H 9/6483* (2013.01); *H03H 9/0571* (2013.01); *H03H 9/0576* (2013.01);
(Continued)

(58) Field of Classification Search
CPC .. H03H 9/0552; H03H 9/0566; H03H 9/0571; H03H 9/0576; H03H 9/6483; H03H 9/706; H03H 9/725
(Continued)

(56) References Cited

U.S. PATENT DOCUMENTS 6,424,238 B1 * 7/2002 Penunuri ................ H03H 9/605
 333/187
6,911,708 B2 * 6/2005 Park ................... H03H 9/02094
 257/125

(Continued)

FOREIGN PATENT DOCUMENTS

JP 2006-074749 A 3/2006
JP 2007-266812 A 10/2007
(Continued)

OTHER PUBLICATIONS

Japanese Office Action dated Feb. 6, 2018, in a counterpart Japanese patent application No. 2015-173245. (A machine translation (not reviewed for accuracy) attached.)

*Primary Examiner* — Barbara Summons
(74) *Attorney, Agent, or Firm* — Chen Yoshimura LLP

(57) ABSTRACT

A multiplexer includes: one or more transmit filters that are connected between an antenna terminal and one or more transmit terminals; one or more receive filters that are connected between the antenna terminal and one or more receive terminals; and a circuit that includes a longitudinally coupled acoustic wave filter and is connected in parallel to one or more series resonators of a first filter that is one of the one or more transmit filters and the one or more receive filters and includes the one or more series resonators and one or more parallel resonators each formed of a piezoelectric thin film resonator, wherein the longitudinally coupled acoustic wave filter is formed of IDTs formed on a chip of a second filter that is another one of the one or more transmit filters and the one or more receive filters and formed of a surface acoustic wave resonator.

13 Claims, 18 Drawing Sheets

(51) Int. Cl.
*H03H 9/05* (2006.01)
*H03H 9/72* (2006.01)

(52) U.S. Cl.
CPC ........ *H03H 9/6433* (2013.01); *H03H 9/6479* (2013.01); *H03H 9/703* (2013.01); *H03H 9/72* (2013.01)

(58) Field of Classification Search
USPC .......................................................... 333/133
See application file for complete search history.

(56) References Cited

U.S. PATENT DOCUMENTS

| | | | |
|---|---|---|---|
| 6,927,649 B2 * | 8/2005 | Metzger ............... | H03H 9/0557 333/133 |
| 2006/0028298 A1 | 2/2006 | Nakamura et al. | |
| 2007/0210876 A1 * | 9/2007 | Yahata ................... | H01P 1/268 333/187 |
| 2011/0193650 A1 * | 8/2011 | Takenoshita ......... | H03H 9/0576 333/4 |
| 2013/0113576 A1 | 5/2013 | Inoue et al. | |
| 2013/0170405 A1 * | 7/2013 | Yan ................... | H03H 9/02015 370/277 |
| 2014/0113571 A1 * | 4/2014 | Fujiwara ................. | H04B 1/40 455/73 |

FOREIGN PATENT DOCUMENTS

| | | |
|---|---|---|
| JP | 2013-118611 A | 6/2013 |
| JP | 2014-82700 A | 5/2014 |

\* cited by examiner

MULTIPLEXER AND MODULE

CROSS-REFERENCE TO RELATED APPLICATION

This application is based upon and claims the benefit of priority of the prior Japanese Patent Application No. 2015-173245, filed on Sep. 2, 2015, the entire contents of which are incorporated herein by reference.

FIELD

A certain aspect of the present invention relates to a multiplexer and a module.

BACKGROUND

In recent years, wireless communication devices such as mobile phones have been reduced in size. Thus, the reduction of the number of parts used in the wireless communication device has been considered. For example, to reduce the number of parts, the omission of an interstage filter in a transmit path or a receive path has been considered. In this case, however, it is required to improve the isolation characteristic of a multiplexer. For example, it has been suggested to connect a resonator in parallel to at least one of a transmit filter and a receive filter to improve the isolation characteristic as disclosed in, for example, Japanese Patent Application Publication Nos. 2013-118611 and 2014-82700 (Patent Documents 1 and 2).

When the transmit filter or the receive filter is formed of piezoelectric thin film resonators, according to Patent Document 1, a longitudinally coupled acoustic wave filter is connected in parallel to a filter formed of piezoelectric thin film resonators. In this case, the longitudinally coupled acoustic wave filter is connected in parallel to a filter formed of piezoelectric thin film resonators, and thus is considered to be formed of piezoelectric thin film resonators. However, it is difficult to improve the isolation characteristic in the longitudinally coupled acoustic wave filter formed of piezoelectric thin film resonators. This is because the control of the resonant frequency of the longitudinally coupled acoustic wave filter allows to improve the isolation characteristic but it is difficult to control the resonant frequency of the longitudinally coupled acoustic wave filter formed of piezoelectric thin film resonators.

SUMMARY OF THE INVENTION

According to a first aspect of the present invention, there is provided a multiplexer including: one or more transmit filters that are connected between an antenna terminal and one or more transmit terminals; one or more receive filters that are connected between the antenna terminal and one or more receive terminals; and a circuit that includes a longitudinally coupled acoustic wave filter and is connected in parallel to one or more series resonators of a first filter that is one of the one or more transmit filters and the one or more receive filters and includes the one or more series resonators and one or more parallel resonators each formed of a piezoelectric thin film resonator, wherein the longitudinally coupled acoustic wave filter is formed of interdigital transducers (IDTs) formed on a chip of a second filter that is another one of the one or more transmit filters and the one or more receive filters and formed of a surface acoustic wave resonator.

According to a second aspect of the present invention, there is provided a module including: the above multiplexer.

DETAILED DESCRIPTION

Figure 1:
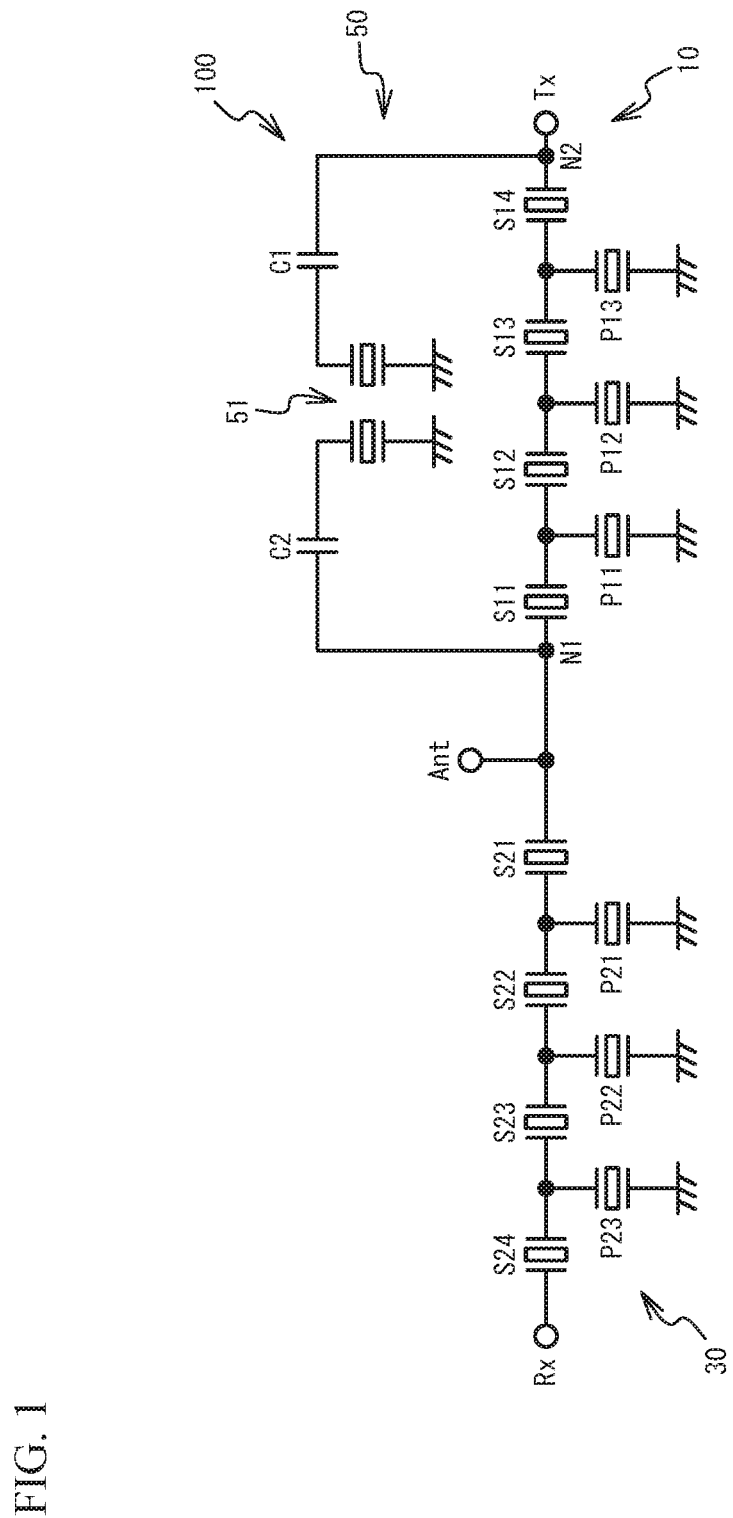
FIG. 1 illustrates a duplexer in accordance with a first embodiment.

Hereinafter, embodiments of the present invention will be described with reference to the accompanying drawings.
First Embodiment FIG. 1 illustrates a duplexer 100 in accordance with a first embodiment. As illustrated in FIG. 1, the duplexer 100 of the first embodiment includes a transmit filter 10, a receive filter 30, and a circuit 50. The transmit filter 10 is connected between an antenna terminal Ant and a transmit terminal Tx. The receive filter 30 is connected between the antenna terminal Ant and a receive terminal Rx. The circuit 50 is connected in parallel to the transmit filter 10.

The transmit filter 10 is a ladder-type filter including one or more series resonators S11 through S14 connected in series and one or more parallel resonators P11 through P13 connected in parallel between the antenna terminal Ant and the transmit terminal Tx. The series resonators S11 through S14 and the parallel resonators P11 through P13 are piezoelectric thin film resonators.

The receive filter 30 is a ladder-type filter including one or more series resonators S21 through S24 connected in series and one or more parallel resonators P21 through P23 connected in parallel between the antenna terminal Ant and the receive terminal Rx. The series resonators S21 through S24 and the parallel resonators P21 through P23 are surface acoustic wave resonators. A boundary acoustic wave resonator or a Love wave resonator may substitute for the surface acoustic wave resonator. That is, the surface acoustic wave resonator in claims is a surface acoustic wave resonator in a broad sense, and includes a boundary acoustic wave resonator and a Love wave resonator.

The transmit filter 10 transmits signals within the transmit band, among signals input to the transmit terminal Tx, to the antenna terminal Ant as a transmission signal, and suppresses signals with other frequencies. The receive filter 30 transmits signals within the receive band, among signals input to the antenna terminal Ant, to the receive terminal Rx as a reception signal, and suppresses signals with other frequencies.

All transmission signals are ideally output from the antenna terminal Ant, but some of transmission signals may pass the receive filter 30 and be output from the receive terminal Rx. Similarly, all reception signals are ideally output from the receive terminal Rx, but some of reception signals may pass the transmit filter 10 and be output from the transmit terminal Tx. The ratio of the electrical power of the transmission signal leaking to the receive terminal Rx to that of the transmission signal input to the transmit terminal Tx is referred to as isolation from the transmit terminal to the receive terminal, and the ratio of the electrical power of the reception signal leaking to the transmit terminal Tx to that of the reception signal input to the antenna terminal Ant is referred to as isolation from the antenna terminal to the transmit terminal.

The circuit 50 is provided to improve the isolation characteristic. The circuit 50 is connected between, for example, a node N1 between the series resonator S11 and the antenna terminal Ant and a node N2 between the series resonator S 14 and the transmit terminal Tx. That is, the circuit 50 is connected in parallel to the series resonators S11 through S14. The circuit 50 includes a longitudinally coupled acoustic wave filter 51 connected in series between the nodes N1 and N2, and capacitors C1 and C2 that are respectively connected in series to the longitudinally coupled acoustic wave filter 51 at the input side and the output side of the longitudinally coupled acoustic wave filter 51. The longitudinally coupled acoustic wave filter 51 are formed of IDTs, and one of the IDTs is coupled to the node N1 and another one is coupled to the node N2. The longitudinally coupled acoustic wave filter 51 is, for example, a double mode surface acoustic wave filter.

The duplexer 100 of the first embodiment supports various communication systems. For example, the duplexer 100 allows transmission signals and reception signals of band 7 (transmit band: 2500 to 2570 MHz, receive band: 2620 to 2690 MHz) to pass therethrough. In this case, the resonant frequency of the longitudinally coupled acoustic wave filter 51 is, for example, 2595 MHz.

Figure 2A:
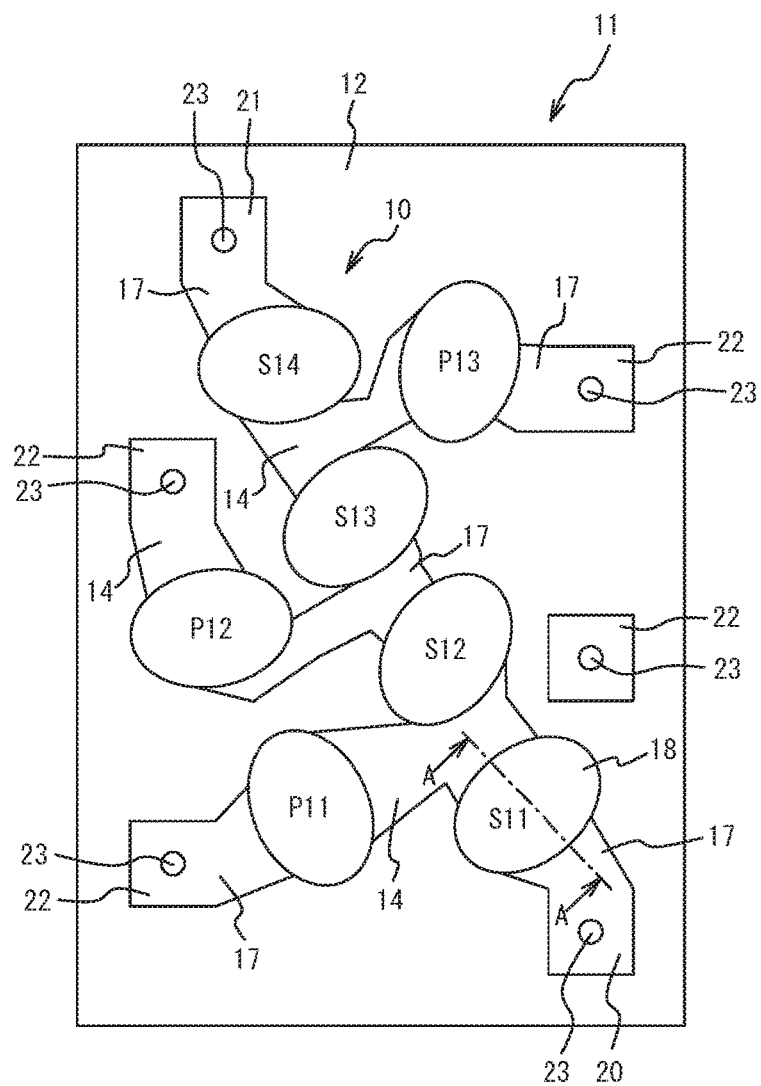
FIG. 2A is a top view of a chip including a transmit filter formed therein.
Figure 2B:
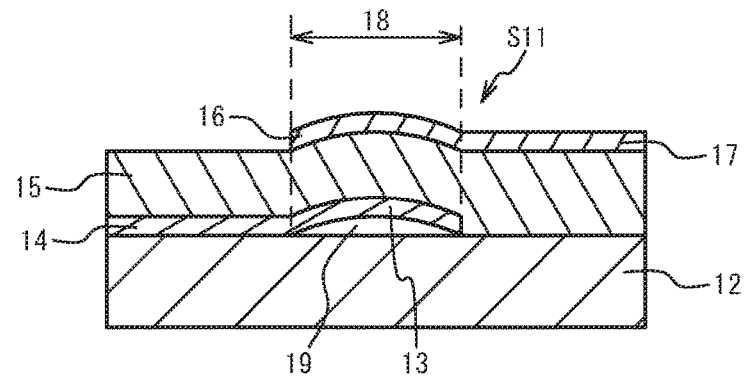
FIG. 2B is a cross-sectional view taken along line A-A in FIG. 2A.

FIG. 2A is a top view of a chip 11 including the transmit filter 10 formed therein, and FIG. 2B is a cross-sectional view taken along line A-A in FIG. 2A. FIG. 2A omits the illustration of a piezoelectric film 15. As illustrated in FIG. 2A, the chip 11 includes the series resonators S11 through S14 and the parallel resonators P11 through P13 formed on a substrate 12 such as, for example, a silicon substrate. The series resonators S11 through S14 are connected in series, between an antenna pad 20 and a transmit pad 21, through lower and upper wiring lines 14 and 17. The parallel resonator P11 is connected between the series resonators S11 and S12 and a ground pad 22. Similarly, the parallel resonator P12 is connected between the series resonators S 12 and S 13 and the ground pad 22, and the parallel resonator P13 is connected between the series resonators S13 and S14 and the ground pad 22. Bumps 23 are formed on the antenna pad 20, the transmit pad 21, and the ground pads 22.

As illustrated in FIG. 2B, formed on the substrate 12 are a lower electrode 13 and a lower wiring line 14 connecting to the lower electrode 13. An air gap 19 having a dome-shaped bulge is formed between the substrate 12 and the lower electrode 13. The dome-shaped bulge is a bulge having a shape in which the height of the air gap 19 is low in the periphery of the air gap 19 and increases at closer distances to the center of the air gap 19, for example. The piezoelectric film 15 is formed on the lower electrode 13, the lower wiring line 14, and the substrate 12. Formed on the piezoelectric film 15 are an upper electrode 16 having a region (a resonance region 18) in which the upper electrode 16 faces the lower electrode 13, and an upper wiring line 17 connecting to the upper electrode 16. The resonance region 18 has an elliptical shape (see FIG. 2A), and is a region in which the thickness extension mode resonates. The series resonator S11 has a structure in which the lower electrode 13, the piezoelectric film 15, and the upper electrode 16 are stacked. The shape of the resonance region 18 is not limited to an elliptical shape, and may be other shapes such as a polygonal shape.

The lower electrode 13 and the lower wiring line 14 are simultaneously formed, and are thus formed of the same material and have an identical film thickness. The upper electrode 16 and the upper wiring line 17 are simultaneously formed, and are thus formed of the same material and have an identical film thickness. The lower electrode 13, the lower wiring line 14, the upper electrode 16, and the upper wiring line 17 may be formed of a single-layer film of, for example, ruthenium, chrome, aluminum, titanium, copper, molybdenum, tungsten, tantalum, platinum, rhodium, or iridium, or a multilayered film of at least two of them. The piezoelectric film 15 may be formed of, for example, an aluminum nitride film, a zinc oxide film, a lead zirconate titanate film, or a lead titanate film.

The air gap 19 may be a recessed portion or a hole portion formed in the upper surface of the substrate 12 instead of the bulge formed between the substrate 12 and the lower electrode 13. An acoustic mirror formed below the lower electrode 13 of the resonance region 18 may substitute for the air gap 19.

FIG. 2B illustrates the series resonator S11, but the series resonators S12 through S 14 and the parallel resonators P11 through P13 also have the structure in which the lower electrode 13, the piezoelectric film 15, and the upper electrode 16 are stacked as the series resonator S11.

Figure 3:
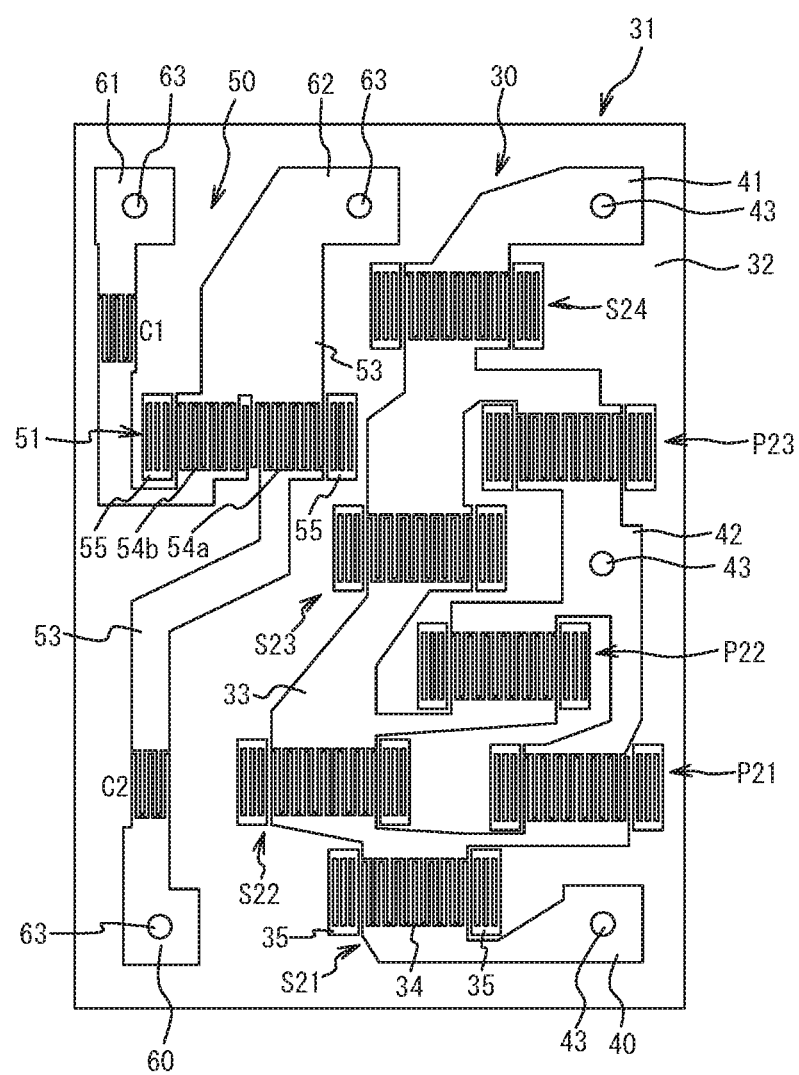
FIG. 3 is a top view of a chip including a receive filter formed therein.

FIG. 3 is a top view of a chip 31 including the receive filter 30 formed therein. As illustrated in FIG. 3, the chip 31 includes the series resonators S21 through S24 and the parallel resonators P21 through P23 formed on a piezoelectric substrate 32 such as, for example, a lithium tantalate substrate or a lithium niobate substrate. The series resonators S21 through S24 are connected in series, between an antenna pad 40 and a receive pad 41, through wiring lines 33. The parallel resonator P21 is connected between the series resonators S21 and S22 and a ground pad 42. Similarly, the parallel resonator P22 is connected between the series resonators S22 and S23 and the ground pad 42, and the parallel resonator P23 is connected between the series resonators S23 and S24 and the ground pad 42. Bumps 43 are formed on the antenna pad 40, the receive pad 41, and the ground pad 42.

Each of the series resonators S21 through S24 and the parallel resonators P21 through P23 includes an Inter Digital Transducer (IDT) 34 and reflectors 35 located at both sides of the IDT 34. The IDT 34 excites a surface acoustic wave on the surface of the piezoelectric substrate 32. The reflector 35 reflects the surface acoustic wave. The IDT 34, the reflectors 35, and the wiring lines 33 are simultaneously formed, and are thus formed of the same material and have an identical film thickness. The IDTs 34, the reflectors 35, and the wiring lines 33 are formed of a metal film such as, for example, aluminum or copper.

The chip 31 further includes the longitudinally coupled acoustic wave filter 51 and the capacitors C1 and C2 formed on the piezoelectric substrate 32. The longitudinally coupled acoustic wave filter 51 includes IDTs 54a and 54b arranged next to each other in the propagation direction of the acoustic wave and reflectors 55 located at both sides of the IDTs 54a and 54b. A first end of the IDT 54a is coupled to a ground pad 62 through a wiring line 53, and a second end of the IDT 54a is coupled to a connection pad 60 through the wiring line 53 and the capacitor C2. A first end of the IDT 54b is coupled to the ground pad 62 through the wiring line 53, and a second end of the IDT 54b is coupled to a connection pad 61 through the wiring line 53 and the capacitor C1. Each of the capacitors C1 and C2 are formed of a pair of comb-shaped electrodes. No reflector is located at both sides of the comb-shaped electrodes of the capacitors C1 and C2. The IDTs 54a and 54b and the reflectors 55 of the longitudinally coupled acoustic wave filter 51 and the comb-shaped electrodes of the capacitors C1 and C2, and the wiring lines 53 are formed at the same time as the IDTs 34 and the reflectors 35 of the series resonators S21 through S24 and the parallel resonators P21 through P23, and the wiring lines 33. Thus, the IDTs 54a and 54b and the reflectors 55 of the longitudinally coupled acoustic wave filter 51, the comb-shaped electrodes of the capacitors C1 and C2, and the wiring lines 53 are formed of the same material and have the same film thickness as the IDTs 34 and the reflectors 35 of the series resonators S21 through S24 and the parallel resonators P21 through P23, and the wiring lines 33. Bumps 63 are formed on the connection pads 60 and 61 and the ground pad 62.

As described above, the circuit 50 including the longitudinally coupled acoustic wave filter 51 and the capacitors C1 and C2 is also formed on the chip 31 in addition to the receive filter 30 including the series resonators S21 through S24 and the parallel resonators P21 through P23.

The antenna pads 20 and 40, the transmit pad 21, the receive pad 41, the ground pads 22, 42, and 62, and the connection pads 60 and 61 are connected to the package substrate by the bumps 23, 43, and 63. Accordingly, the antenna pads 20 and 40 correspond to the antenna terminal Ant in FIG. 1, the transmit pad 21 corresponds to the transmit terminal Tx in FIG. 1, the receive pad 41 corresponds to the receive terminal Rx in FIG. 1, and the ground pads 22, 42, and 62 correspond to the grounds in FIG. 1.

Figure 4:
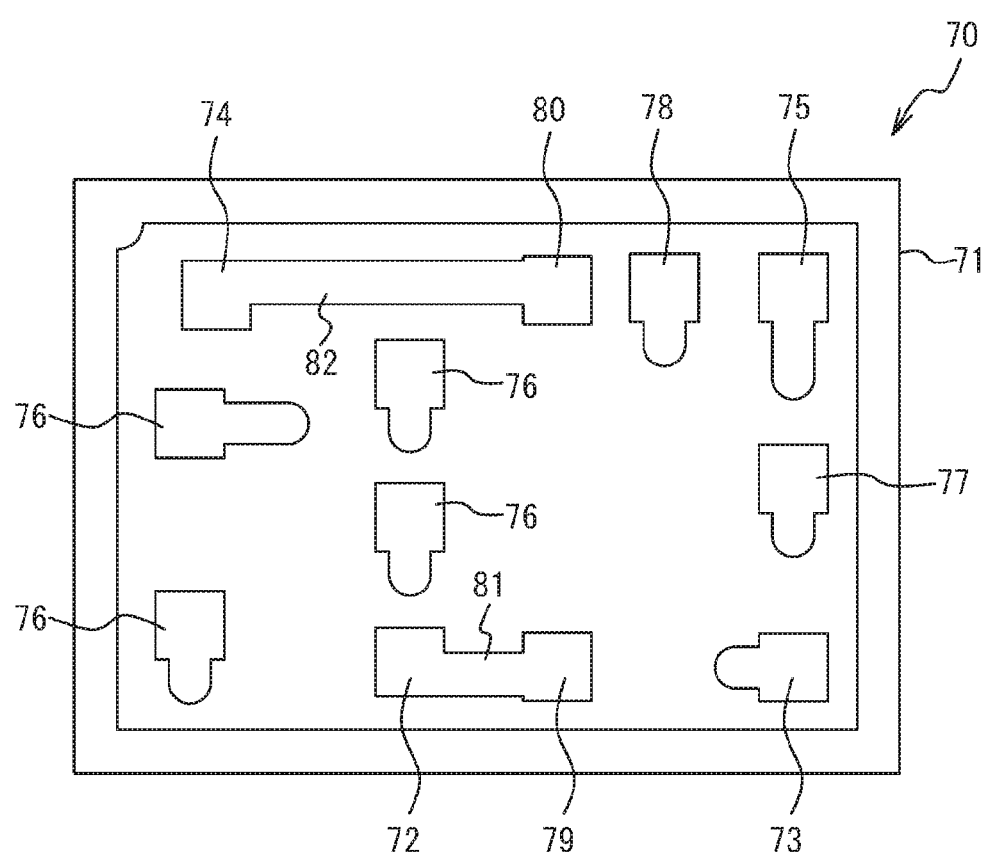
FIG. 4 is a top view of a die attach layer of a package substrate on which the chips are to be mounted.

FIG. 4 is a top view of a die attach layer 71 of a package substrate 70 on which the chips 11 and 31 are to be mounted. As illustrated in FIG. 4, on the upper surface of the die attach layer 71 made of an insulating material such as ceramic, formed are antenna pads 72 and 73, a transmit pad 74, a receive pad 75, ground pads 76 through 78, connection pads 79 and 80, and wiring lines 81 and 82. The wiring line 81 connects the antenna pad 72 and the connection pad 79. The wiring line 82 connects the transmit pad 74 and the connection pad 80.

The antenna pad 20, the transmit pad 21, and the ground pads 22 formed on the chip 11 are respectively connected to the antenna pad 72, the transmit pad 74, and the ground pads 76 by the bumps 23. The antenna pad 40, the receive pad 41, and the ground pad 42 formed on the chip 31 are respectively connected to the antenna pad 73, the receive pad 75, and the ground pad 77 by the bumps 43. The connection pads 60 and 61 and the ground pad 62 formed on the chip 31 are respectively connected to the connection pads 79 and 80 and the ground pad 78 by the bumps 63. In the above described manner, the chips 11 and 31 are flip-chip mounted on the die attach layer 71.

Figure 5:
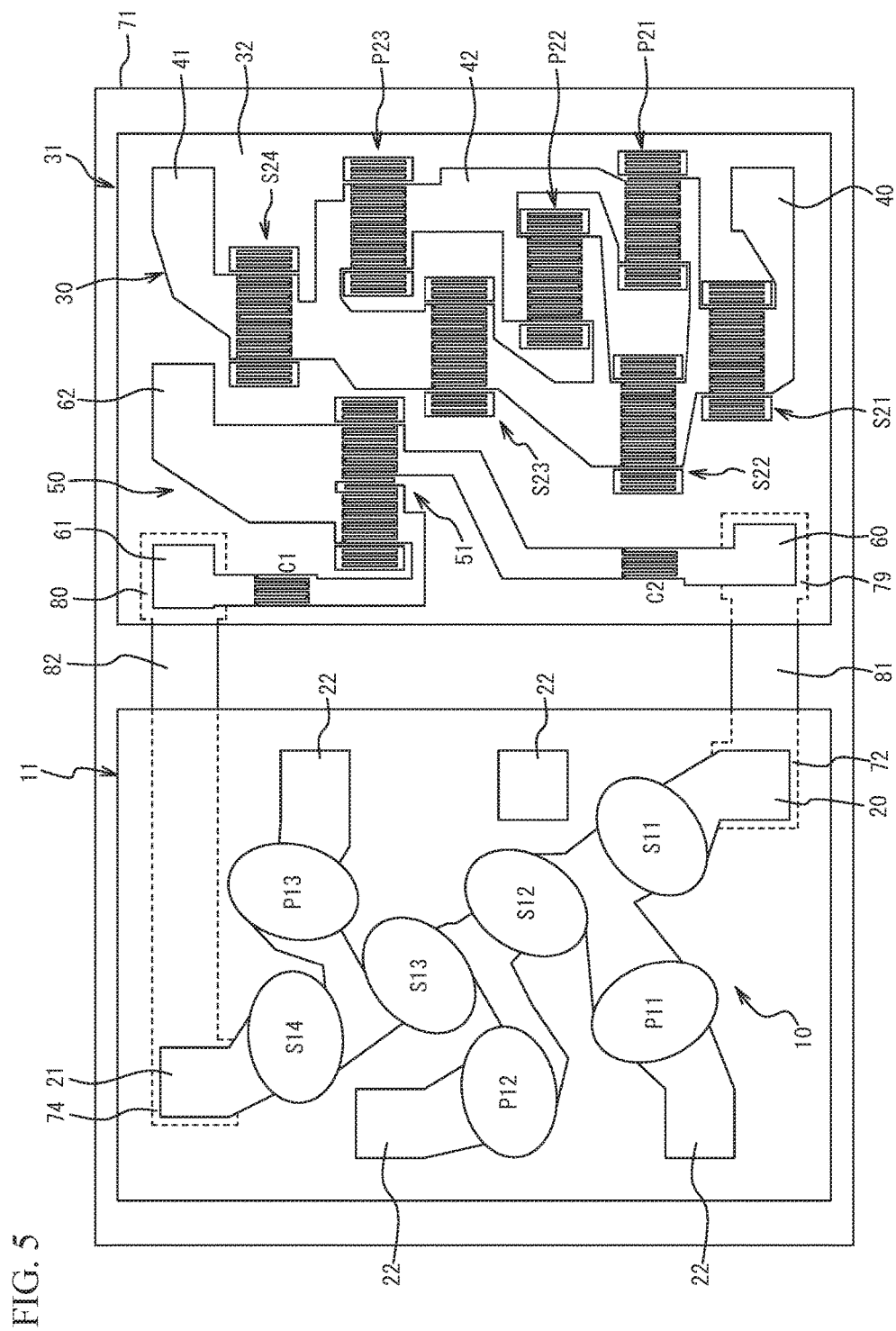
FIG. 5 illustrates a state where the chips are flip-chip mounted on the die attach layer.

FIG. 5 illustrates a state where the chips 11 and 31 are flip-chip mounted on the die attach layer 71. FIG. 5 omits the illustration of the substrate to illustrate the transmit filter 10, the receive filter 30, and the circuit 50. Only the antenna pad 72, the transmit pad 74, and the connection pads 79 and 80 are illustrated among the pads formed on the upper surface of the die attach layer 71.

As illustrated in FIG. 5, the connection pad 60 formed on the chip 31 is coupled to the antenna pad 20 formed on the chip 11 through the connection pad 79, the wiring line 81, and the antenna pad 72 formed on the die attach layer 71. The connection pad 61 formed on the chip 31 is coupled to the transmit pad 21 formed on the chip 11 through the connection pad 80, the wiring line 82, and the transmit pad 74 formed on the die attach layer 71. Accordingly, the circuit 50 formed on the chip 31 is connected in parallel to the transmit filter 10 formed on the chip 11.

In the first embodiment, as illustrated in FIG. 1, the circuit 50 including the longitudinally coupled acoustic wave filter 51 is connected in parallel to the transmit filter 10. To improve the attenuation in the receive band of the transmit filter 10 to improve the isolation characteristic of the receive band, it is required to control the resonant frequency of the longitudinally coupled acoustic wave filter 51. However, when the longitudinally coupled acoustic wave filter 51 is formed of piezoelectric thin film resonators, it is difficult to control the resonant frequency precisely. This is because the resonant frequency of the piezoelectric thin film resonator changes due to the film thickness of the multilayered film including the lower electrode, the piezoelectric film, and the upper electrode, and it is thus difficult to control the film thickness precisely due to the effect of the variation in the film thickness in the wafer surface. Therefore, in the first embodiment, as illustrated in FIG. 5, the longitudinally coupled acoustic wave filter 51 is connected in parallel to the transmit filter 10 formed of piezoelectric thin film resonators, and is formed of the IDTs formed on the chip 31 of the receive filter 30 formed of surface acoustic wave resonators. When the longitudinally coupled acoustic wave filter 51 is formed of IDTs, the resonant frequency can be controlled with an IDT pitch or the like, and thus the resonant frequency can be controlled precisely. Therefore, the first embodiment improves the isolation characteristic.

Moreover, in the first embodiment, as illustrated in FIG. 5, the chip 11 of the transmit filter 10 and the chip 31 of the receive filter 30 are mounted on the die attach layer 71 of the package substrate 70 to be next to each other. The circuit 50 including the longitudinally coupled acoustic wave filter 51 is connected in parallel to the transmit filter 10 through the wiring lines 81 and 82 located on the die attach layer 71. Accordingly, the circuit 50 including the longitudinally coupled acoustic wave filter 51 is easily connected in parallel to the transmit filter 10, and the wiring lines 81 and 82 are inhibited from being long.

Moreover, in the first embodiment, as illustrated in FIG. 1 and FIG. 5, the circuit 50 includes the capacitors C1 and C2 that are respectively connected in series to the longitudinally coupled acoustic wave filter 51 at the input and output sides of the longitudinally coupled acoustic wave filter 51 and formed of comb-shaped electrodes. When the capacitors C1 and C2 are connected in series to the longitudinally coupled acoustic wave filter 51, the input and output impedance of the circuit 50 is made high, and the amount of signals flowing into the circuit 50 is reduced. Therefore, the increase in loss is reduced. The capacitances of the capacitors C1 and C2 are determined in consideration of the amount of signals flowing into the circuit 50.

In the first embodiment, the circuit 50 is connected in parallel to all the series resonators S11 through S14 of the transmit filter 10, but may be connected in parallel to one or some of the series resonators S11 through S14.

Figure 6A:
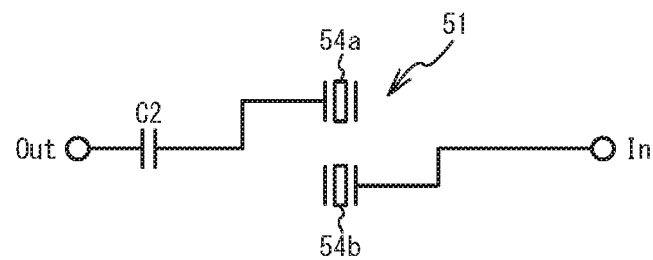
FIG. 6A through FIG. 6F illustrate alternative examples of a circuit.
Figure 6B:
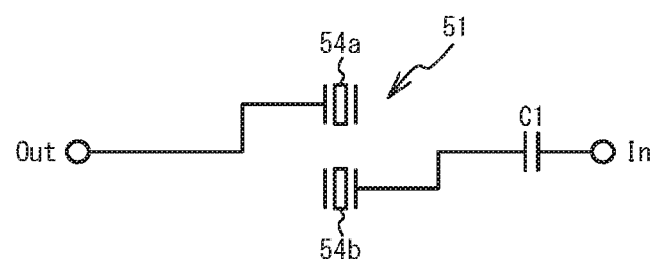
Figure 6C:
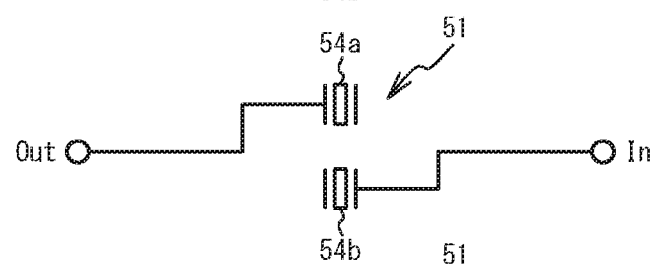
Figure 6D:
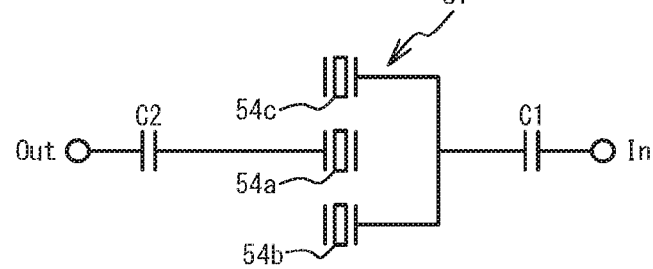
Figure 6E:
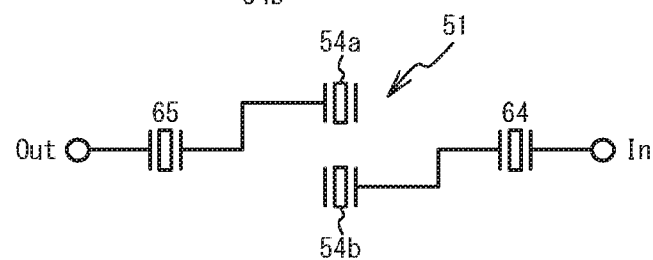
Figure 6F:
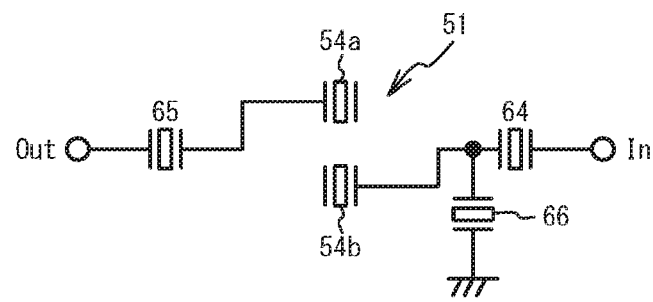

FIG. 6A through FIG. 6F illustrate alternative examples of the circuit 50. As illustrated in FIG. 6A, the capacitor C1 at the input side of the longitudinally coupled acoustic wave filter 51 may not be connected. As illustrated in FIG. 6B, the capacitor C2 at the output side of the longitudinally coupled acoustic wave filter 51 may not be connected. As illustrated in FIG. 6C, none of the capacitors C1 and C2 at the input and output sides of the longitudinally coupled acoustic wave filter 51 may be connected. In this case, the input and output impedance of the circuit 50 is preferably increased with the longitudinally coupled acoustic wave filter 51. As illustrated in FIG. 6D, the longitudinally coupled acoustic wave filter 51 may include three IDTs 54a through 54c. As illustrated in FIG. 6E, the longitudinally coupled acoustic wave filter 51 may include acoustic wave resonators 64 and 65 instead of the capacitors C1 and C2. In this case, the adjustment of the resonant frequencies of the acoustic wave resonators 64 and 65 reduces the amount of signals flowing into the circuit 50. As illustrated in FIG. 6F, an acoustic wave resonator 66 may be located between a node at the input side and/or the output side of the longitudinally coupled acoustic wave filter 51 and ground.

Figure 7:
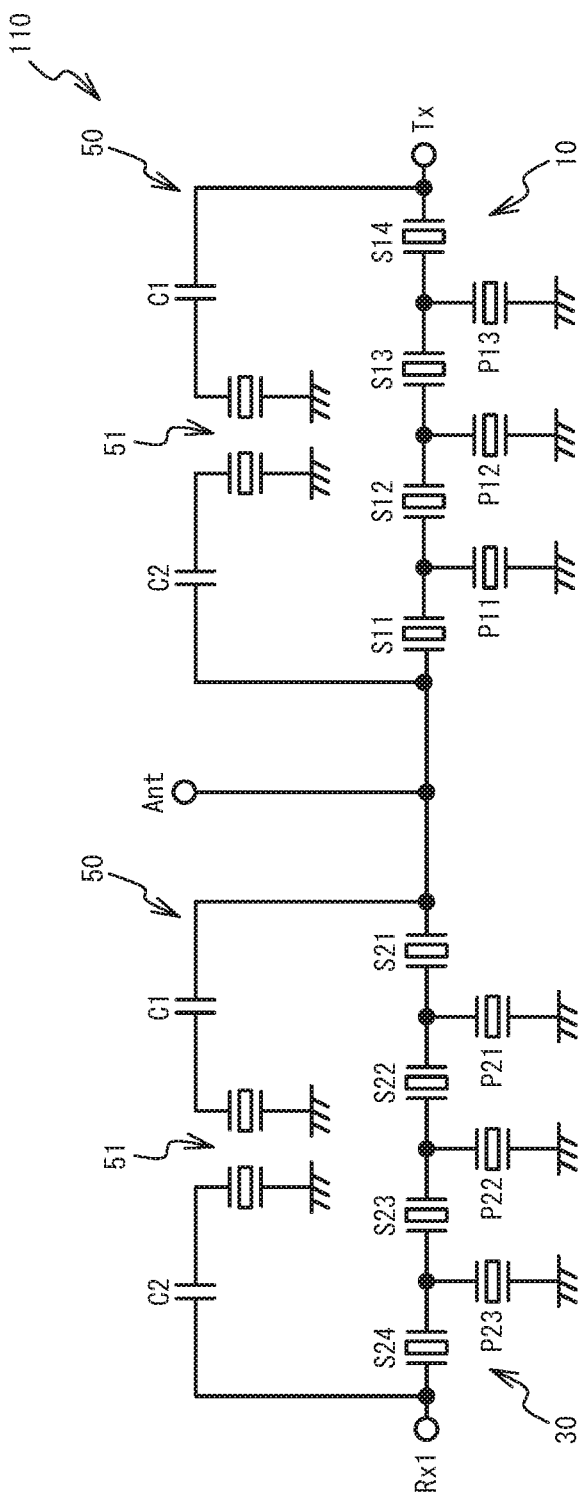
FIG. 7 illustrates a duplexer in accordance with a first variation of the first embodiment.

FIG. 7 illustrates a duplexer 110 in accordance with a first variation of the first embodiment. As illustrated in FIG. 7, the duplexer 110 of the first variation of the first embodiment includes the circuit 50, including the longitudinally coupled acoustic wave filter 51, connected in parallel to the receive filter 30 in addition to the circuit 50 connected in parallel to the transmit filter 10. Although not illustrated, both the longitudinally coupled acoustic wave filter 51 connected in parallel to the transmit filter 10 and the longitudinally coupled acoustic wave filter 51 connected in parallel to the receive filter 30 are located on the chip 31 of the receive filter 30 formed of surface acoustic wave resonators. Other configurations are the same as those of the first embodiment, and thus the description thereof is omitted.

In the first variation of the first embodiment, the circuit 50 including the longitudinally coupled acoustic wave filter 51 is connected in parallel to the receive filter 30. This configuration improves the attenuation in the transmit band of the receive filter 30, thereby improving the isolation characteristic of the transmit band.

Figure 8:
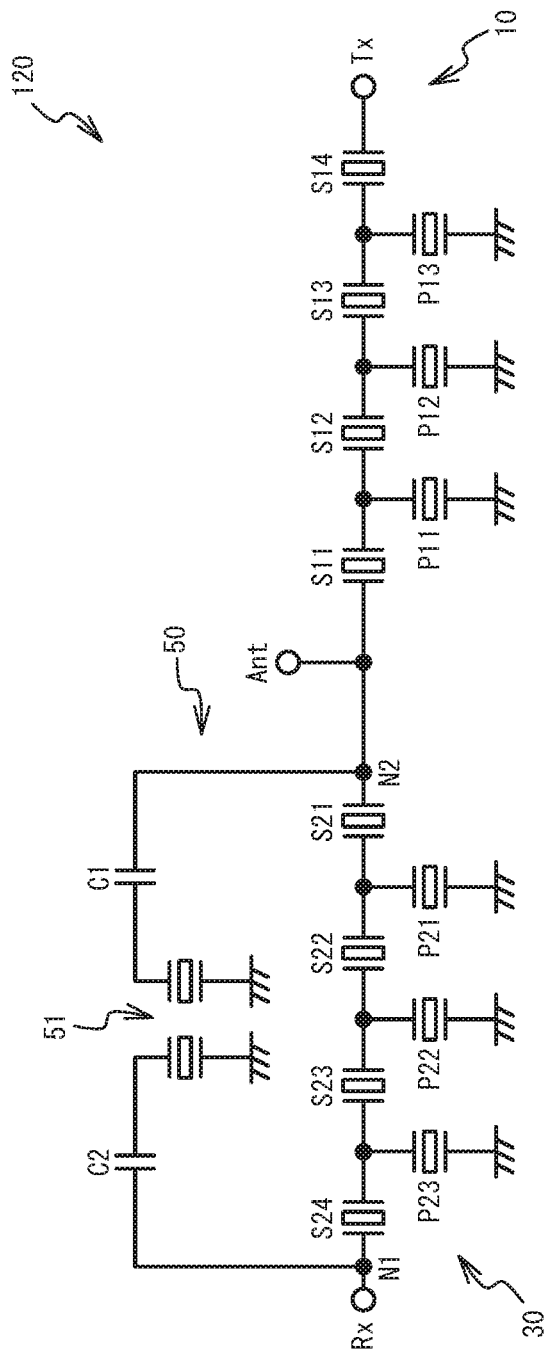
FIG. 8 illustrates a duplexer in accordance with a second variation of the first embodiment.

FIG. 8 illustrates a duplexer 120 in accordance with a second variation of the first embodiment. In the first embodiment, the series resonators S11 through S14 and the parallel resonators P11 through P13 of the transmit filter 10 are formed of piezoelectric thin film resonators, and the series resonators S21 through S24 and the parallel resonators P21 through P23 of the receive filter 30 are formed of surface acoustic wave resonators. In contrast, in the second variation of the first embodiment, the series resonators S11 through S14 and the parallel resonators P11 through P13 of the transmit filter 10 are formed of surface acoustic wave resonators, and the series resonators S21 through S24 and the parallel resonators P21 through P23 of the receive filter 30 are formed of piezoelectric thin film resonators. The circuit 50 is connected in parallel to the receive filter 30 formed of piezoelectric thin film resonators. Although not illustrated, the longitudinally coupled acoustic wave filter 51 included in the circuit 50 is located on the chip of the transmit filter 10 formed of surface acoustic wave resonators as in the first embodiment. Other configurations are the same as those of the first embodiment, and thus the description thereof is omitted.

The duplexer 120 of the second variation of the first embodiment supports various communication systems, and allows transmission signals and reception signals of, for example, band 3 (transmit band: 1710 to 1785 MHz, receive band: 1805 to 1880 MHz) to pass therethrough. In this case, the resonant frequency of the longitudinally coupled acoustic wave filter 51 is, for example, 1795 MHz.

Figure 9:
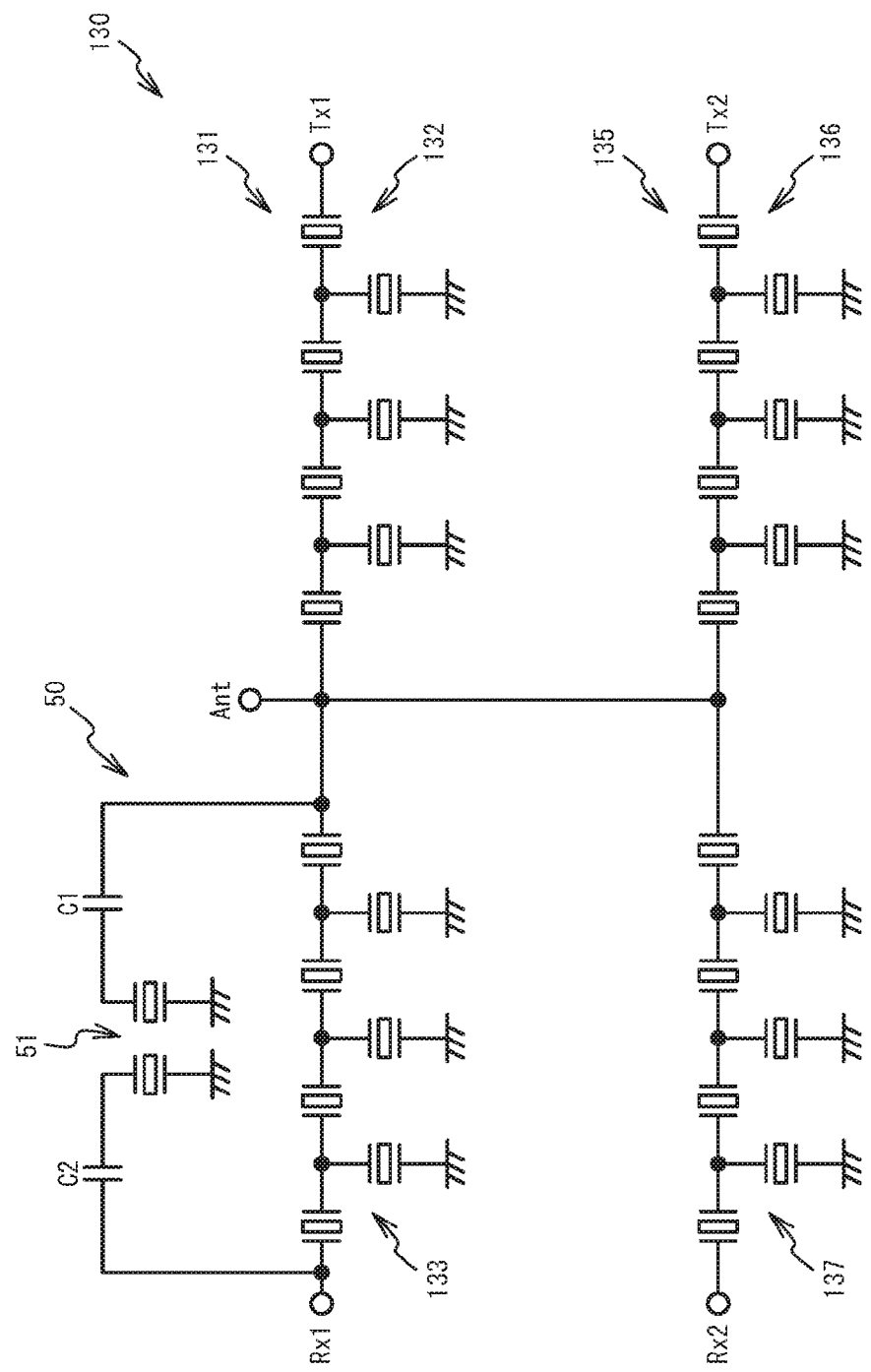
FIG. 9 illustrates a quadplexer in accordance with a third variation of the first embodiment.

FIG. 9 illustrates a quadplexer 130 in accordance with a third variation of the first embodiment. As illustrated in FIG. 9, the quadplexer 130 of the third variation of the first embodiment includes a first duplexer 131 and a second duplexer 135. The first duplexer 131 includes a transmit filter 132 connected between the antenna terminal Ant and a first transmit terminal Tx1 and a receive filter 133 connected between the antenna terminal Ant and a first receive terminal Rx1. The second duplexer 135 includes a transmit filter 136 connected between the antenna terminal Ant and a second transmit terminal Tx2 and a receive filter 137 connected between the antenna terminal Ant and a second receive terminal Rx2.

The receive filter 133 of the first duplexer 131 is formed of piezoelectric thin film resonators, and the transmit filter 132 of the first duplexer 131 and the transmit filter 136 and the receive filter 137 of the second duplexer 135 are formed of surface acoustic wave resonators. The circuit 50 is connected in parallel to the receive filter 133 formed of piezoelectric thin film resonators. Although not illustrated, the longitudinally coupled acoustic wave filter 51 included in the circuit 50 is located on the chip of one of the transmit filter 132, the transmit filter 136, and the receive filter 137 formed of surface acoustic wave resonators as in the first embodiment. Other configurations are the same as those of the first embodiment, and thus the description thereof is omitted.

The quadplexer 130 of the third variation of the first embodiment supports various communication systems. For example, the first duplexer 131 allows transmission signals and reception signals of band 2 (transmit band: 1850 to 1910 MHz, receive band: 1930 to 1990 MHz) to pass therethrough. The second duplexer 135 allows transmission signals and reception signals of band 4 (transmit band: 1710 to 1755 MHz, receive band: 2110 to 2155 MHz) to pass therethrough. In this case, the resonant frequency of the longitudinally coupled acoustic wave filter 51 is, for example, 1920 MHz.

The first embodiment through the second variation of the first embodiment have described exemplary cases where the multiplexer is a duplexer, and the third variation of the first embodiment has described an exemplary case where the multiplexer is a quadplexer. However, this does not intend to suggest any limitation. The multiplexer may be other kinds of multiplexers.

Second Embodiment

The first embodiment has described an exemplary case where each of the capacitors C1 and C2 of the circuit 50 is formed of a pair of comb-shaped electrodes. Here, a description will be given of a simulation conducted on a filter in which the circuit 50 including the longitudinally coupled acoustic wave filter 51 and the capacitors C1 and C2 each formed of a pair of comb-shaped electrodes is connected in parallel to a ladder-type filter formed of surface acoustic wave resonators. In the simulation, the pitches of the comb-shaped electrodes of the capacitors C1 and C2 were changed to obtain the pass characteristic of the filter and the frequency characteristics of the capacitors C1 and C2. FIG. 10A through FIG. 11B illustrate the results of the simulation. The chain lines indicate the frequency characteristic of the capacitor C1, the long dashed double-dotted lines indicate the frequency characteristic of the capacitor C2, and the solid lines indicate the pass characteristic of the filter.

Figure 10A:
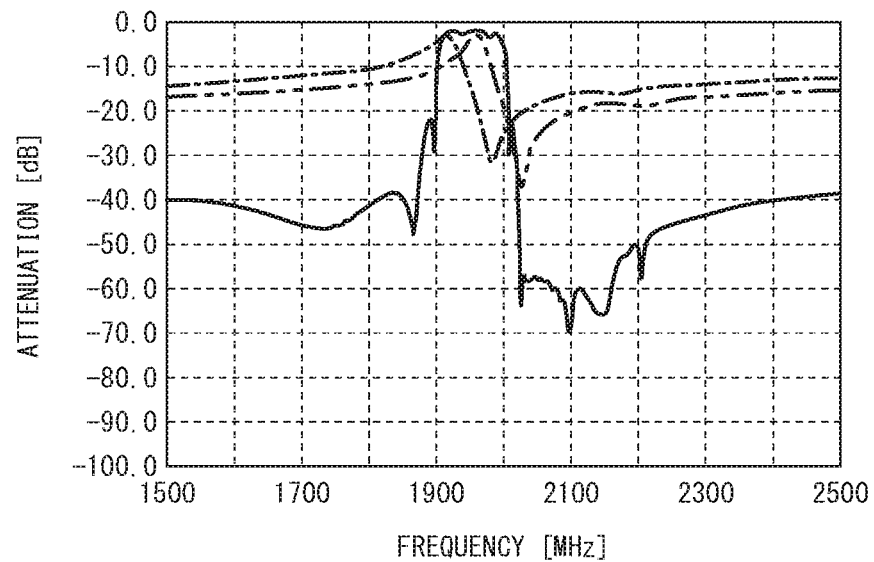
FIG. 10A and FIG. 10B are diagrams (No. 1) illustrating the results of a simulation.
Figure 10B:
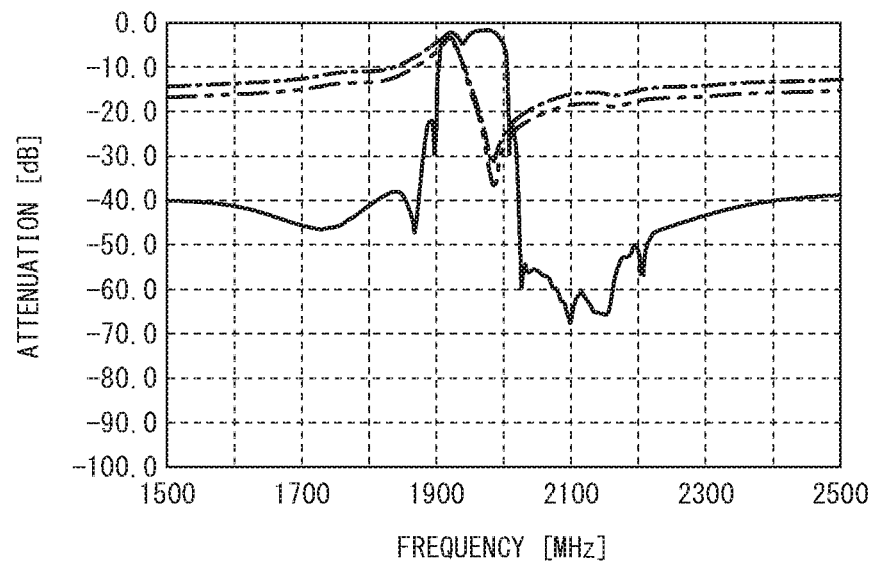

FIG. 10A illustrates the simulation result when the pitch of the comb-shaped electrode of the capacitor C1 is 2.0 μm and the pitch of the comb-shaped electrode of the capacitor C2 is 1.95 μm. FIG. 10B illustrates the simulation result when the pitches of the comb-shaped electrodes of the capacitors C1 and C2 are 2.0 μm. As illustrated in FIG. 10A and FIG. 10B, it is confirmed that unnecessary response is generated in the passband of the pass characteristic of the filter due to the effect of the frequency characteristics of the capacitors C1 and C2.

Figure 11A:
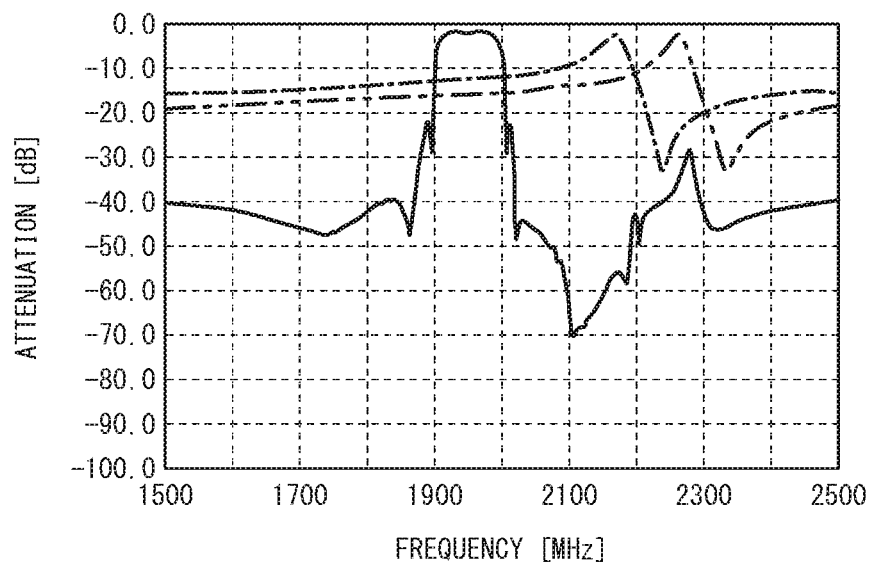
FIG. 11A and FIG. 11B are diagrams (No. 2) illustrating the results of the simulation.
Figure 11B:
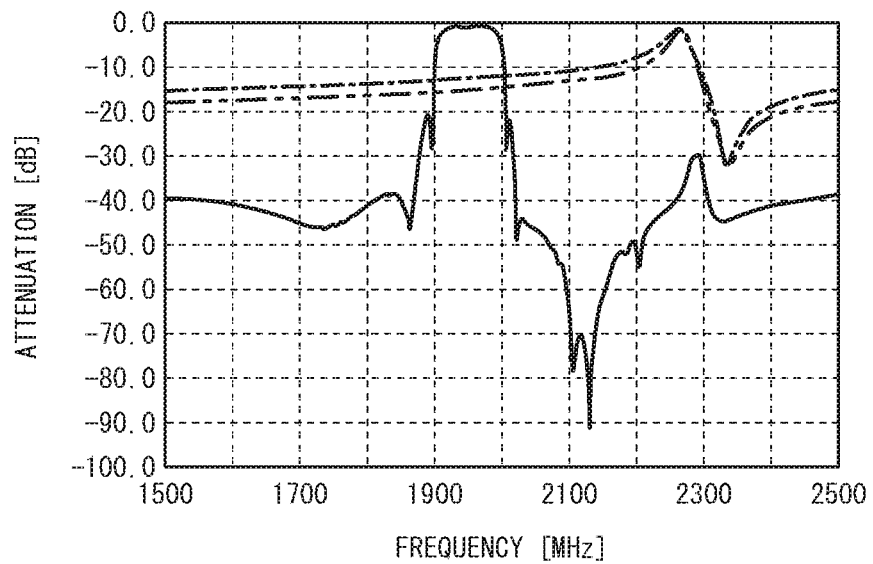

FIG. 11A illustrates the simulation results when the pitch of the comb-shaped electrode of the capacitor C1 is 1.7 μm and the pitch of the comb-shaped electrode of the capacitor C2 is 1.6 μm. FIG. 11B illustrates the simulation results when the pitches of the comb-shaped electrodes of the capacitors C1 and C2 are 1.6 μm. As illustrated in FIG. 11A and FIG. 11B, it is confirmed that unnecessary response is generated outside the passband of the pass characteristic of the filter due to the effect of the frequency characteristics of the capacitors C1 and C2.

As illustrated in FIG. 10A through FIG. 11B, when each of the capacitors C1 and C2 of the circuit 50 is formed of a pair of comb-shaped electrodes, unnecessary response is generated in or outside the passband of the pass characteristic of the filter, and the filter characteristic degrades. Thus, the second embodiment describes an exemplary case where the capacitors C1 and C2 are formed with a steric wiring structure to inhibit the degradation of the filter characteristic due to the occurrence of unnecessary response. As in the first embodiment, in a duplexer in accordance with the second embodiment, the transmit filter 10 formed of piezoelectric thin film resonators is connected between the antenna terminal Ant and the transmit terminal Tx, and the receive filter 30 formed of surface acoustic wave resonators is connected between the antenna terminal Ant and the receive terminal Rx. The circuit 50 including the longitudinally coupled acoustic wave filter 51 and the capacitors C1 and C2 are connected in parallel to the transmit filter 10.

Figure 12:
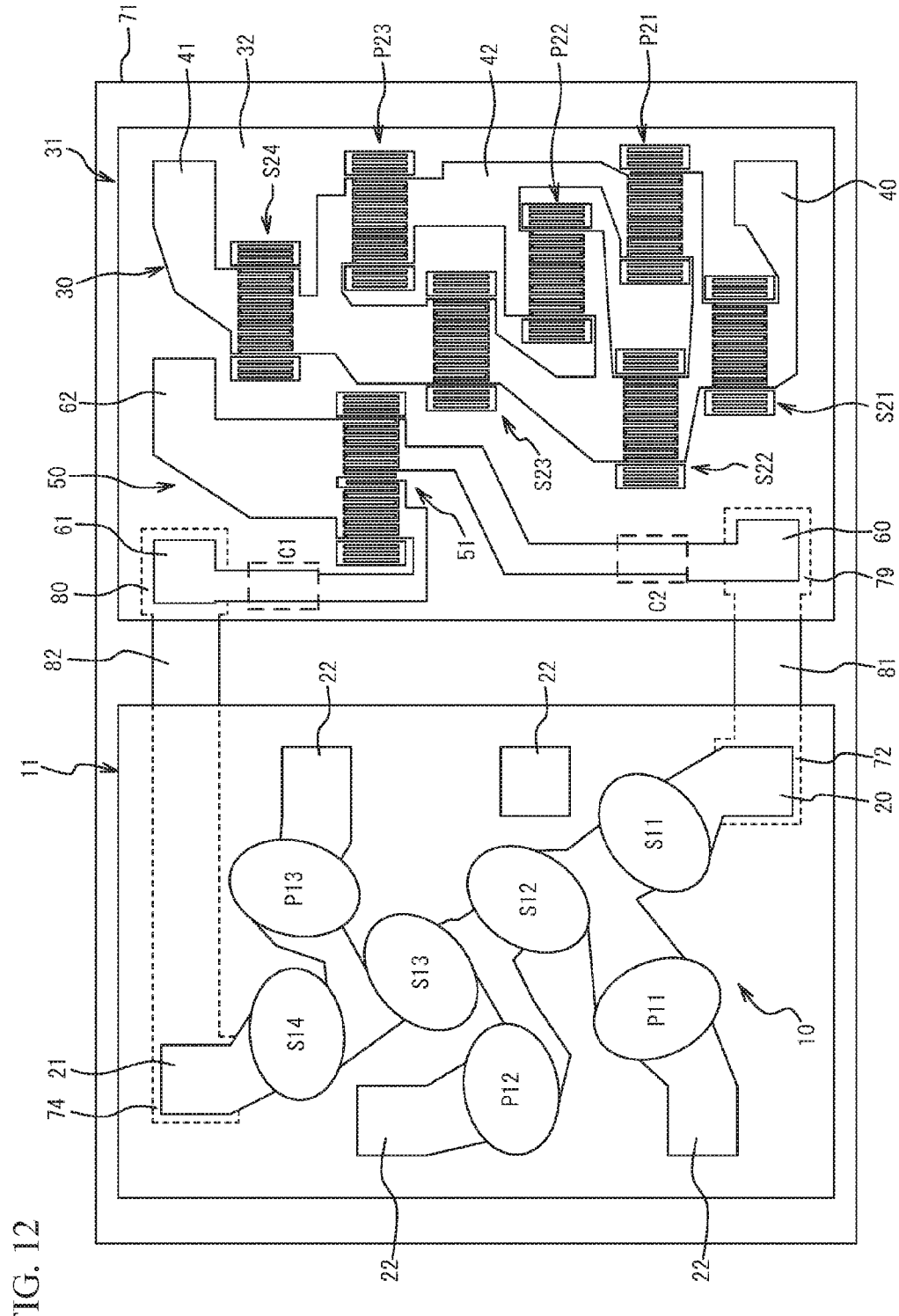
FIG. 12 illustrates a state where a chip including a transmit filter of a duplexer of a second embodiment formed therein and a chip including a receive filter of the duplexer of the second embodiment formed therein are flip-chip mounted on the die attach layer.
Figure 13A:
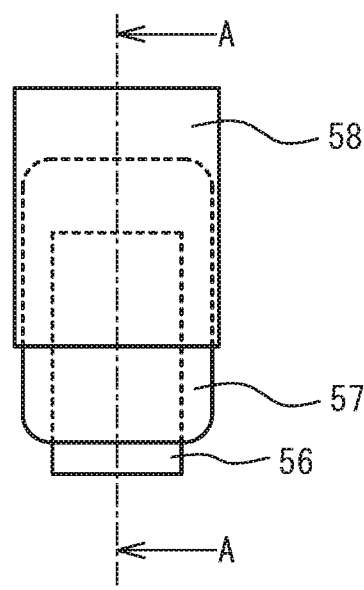
FIG. 13A is an enlarged top view of the dashed line region of a capacitor in FIG. 12.
Figure 13B:
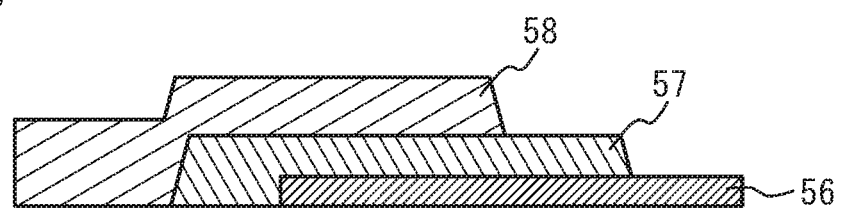
FIG. 13B is a cross-sectional view taken along line A-A in FIG. 13A.

FIG. 12 illustrates a state where the chip 11 including the transmit filter 10 of the duplexer of the second embodiment formed therein and the chip 31 including the receive filter 30 of the duplexer of the second embodiment formed therein are flip-chip mounted on the die attach layer 71. FIG. 13A is an enlarged top view of the dashed line region of the capacitor C1 in FIG. 12, and FIG. 13B is a cross-sectional view taken along line A-A in FIG. 13A. The dashed line region of the capacitor C2 is the same as that in FIG. 13A and FIG. 13B, and thus the description is omitted.

As illustrated in FIG. 12 through FIG. 13B, the capacitors C1 and C2 of the circuit 50 have a steric wiring structure in which the dielectric film 57 is sandwiched between lower and upper wiring lines 56 and 58. The lower wiring line 56 is coupled to, for example, an IDT of the longitudinally coupled acoustic wave filter 51. The upper wiring line 58 is coupled to, for example, the connection pad 61. The lower wiring line 56 is formed at the same time as the longitudinally coupled acoustic wave filter 51, the series resonators S21 through S24, the parallel resonators P21 through P23, and the wiring lines 33. Therefore, the lower wiring line 56 is made of the same material and has the same film thickness as the IDT of the longitudinally coupled acoustic wave filter 51, the IDTs of the series resonators S21 through S24 and the parallel resonators P21 through P23, and the wiring lines 33. The lower wiring line 56 is made of a metal film such as, for example, aluminum or copper. The upper wiring line 58 is made of a metal film such as, for example, gold. A dielectric film 57 is made of, for example, a polyimide resin, an epoxy resin, a silicon oxide film, or an aluminum oxide film.

The lower wiring line 56 may not be formed at the same time as the longitudinally coupled acoustic wave filter 51, and the upper wiring line 58 may be formed at the same time as the longitudinally coupled acoustic wave filter 51. In this case, the lower wiring line 56 is formed of a different material and has a different film thickness from the IDT of the longitudinally coupled acoustic wave filter 51, and the upper wiring line 58 is formed of the same material and has the same film thickness as the IDT of the longitudinally coupled acoustic wave filter 51.

In the second embodiment, the capacitors C1 and C2 of the circuit 50 have the steric wiring structure in which the dielectric film 57 is sandwiched between the lower and upper wiring lines 56 and 58. This configuration reduces unnecessary response generated when the capacitors C1 and C2 are formed of comb-shaped electrodes, and inhibits the degradation of the filter characteristic.

In the second embodiment, the lower wiring line 56 or the upper wiring line 58 is formed at the same time as the longitudinally coupled acoustic wave filter 51, and is thus made of the same material and has the same film thickness as the IDT of the longitudinally coupled acoustic wave filter 51. Therefore, the production cost is reduced.

Third Embodiment

Figure 14:
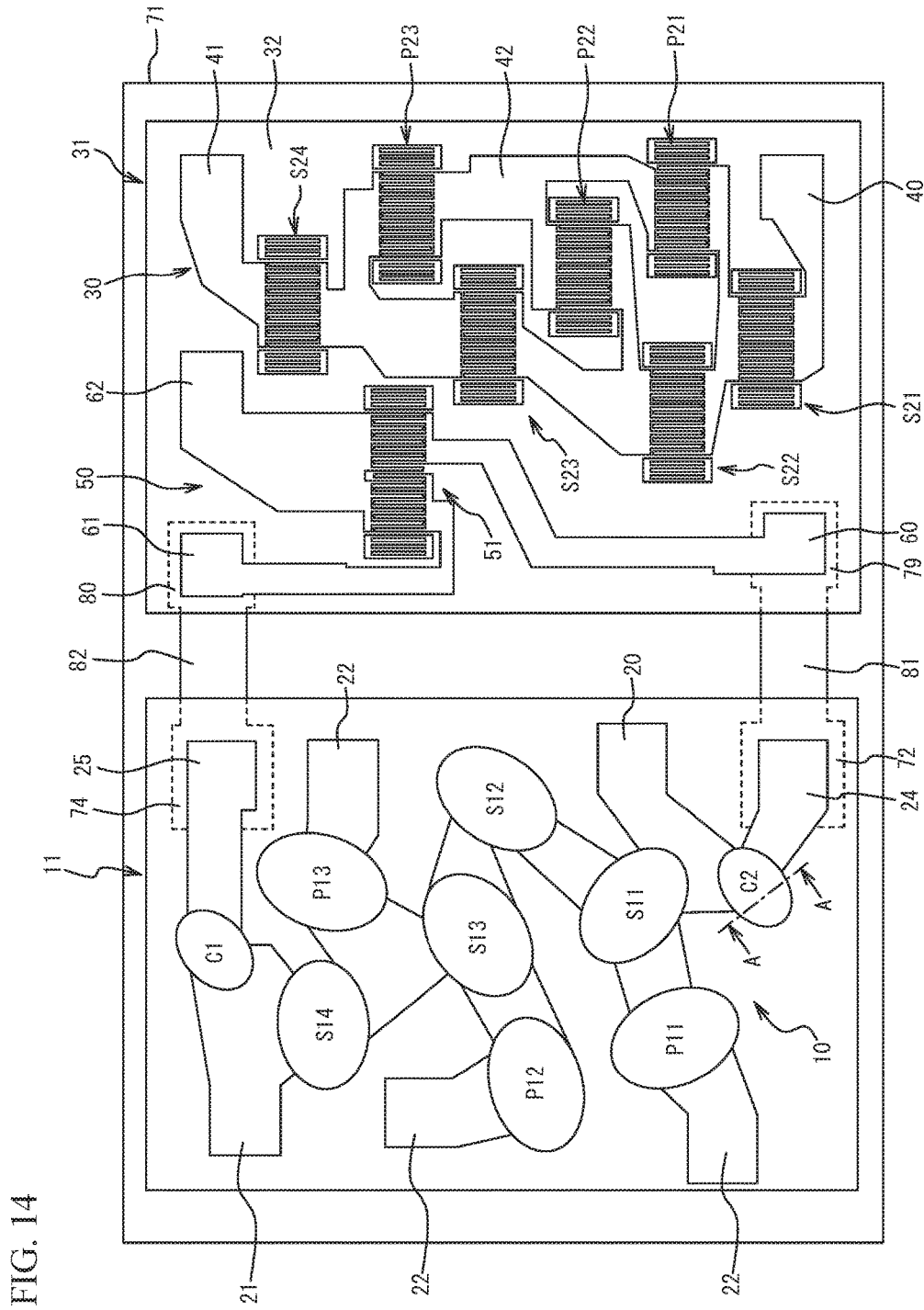
FIG. 14 illustrates a state where a chip including a transmit filter of a duplexer of a third embodiment formed therein and a chip including a receive filter of the duplexer of the third embodiment formed therein are flip-chip mounted on the die attach layer.
Figure 15:
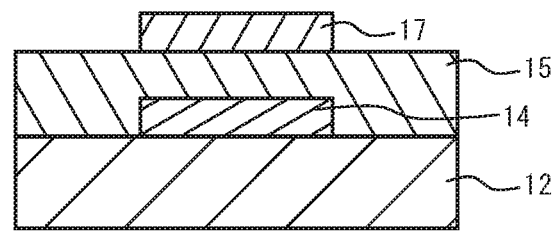
FIG. 15 is a cross-sectional view taken along line A-A in FIG. 14.

FIG. 14 illustrates a state where the chip 11 including the transmit filter 10 of a duplexer of a third embodiment formed therein and the chip 31 including the receive filter 30 of the duplexer of the third embodiment formed therein are flip-chip mounted on the die attach layer 71. FIG. 15 is a cross-sectional view taken along line A-A in FIG. 14. As in the first embodiment, in the duplexer of the third embodiment, the transmit filter 10 formed of piezoelectric thin film resonators is connected between the antenna terminal Ant and the transmit terminal Tx, and the receive filter 30 formed of surface acoustic wave resonators is connected between the antenna terminal Ant and the receive terminal Rx. The circuit 50 including the longitudinally coupled acoustic wave filter 51 and the capacitors C1 and C2 is connected in parallel to the transmit filter 10.

As illustrated in FIG. 14, the capacitors C1 and C2 of the circuit 50 are located on the chip 11 including the transmit filter 10 formed therein. The connection pads 60 and 61 of the chip 31 are respectively coupled to connection pads 24 and 25 of the chip 11 through the wiring lines 81 and 82. The antenna pad 40 of the chip 31 and the antenna pad 20 of the chip 11 are interconnected through a wiring line (not illustrated) located on the package substrate 70 (for example, the die attach layer 71). As illustrated in FIG. 15, the capacitors C1 and C2 have a steric wiring structure in which the piezoelectric film 15 is sandwiched between the lower and upper wiring lines 14 and 17.

As described in the third embodiment, the capacitors C1 and C2 having the steric wiring structure in which the piezoelectric film 15 is sandwiched between the lower and upper wiring lines 14 and 17 may be located on the chip 11 of the transmit filter 10 formed of piezoelectric thin film resonators. This configuration also inhibits the occurrence of the unnecessary response, and inhibits the degradation of the filter characteristic.

As described in the first embodiment, the lower wiring line 14 and the lower electrode 13 are simultaneously formed, and are thus made of the same material and have an identical same film thickness. The upper wiring line 17 and the upper electrode 16 are simultaneously formed, and are thus made of the same material and have an identical film thickness. That is, the capacitors C1 and C2 are formed at the same time as the series resonators S11 through S14 and the parallel resonators P11 through P13, and the lower wiring lines 14, the piezoelectric films 15, and the upper wiring lines 17 of the capacitors C1 and C2 are made of the same material and have the same film thickness as the lower electrodes 13, the piezoelectric films 15, and the upper electrodes 16 of the series resonators S11 through S 14 and the parallel resonators P11 through P13. Therefore, the production cost is reduced.

In the third embodiment, the capacitors C1 and C2 may not have the structure in which the piezoelectric film 15 is sandwiched between the lower and upper wiring lines 14 and 17, and may have a structure in which a dielectric film made of a different material from the piezoelectric film 15 is sandwiched between the lower and upper wiring lines 14 and 17.

Fourth Embodiment

As in the first embodiment, in a fourth embodiment, the transmit filter 10 formed of piezoelectric thin film resonators is connected between the antenna terminal Ant and the transmit terminal Tx, and the receive filter 30 formed of surface acoustic wave resonators is connected between the antenna terminal Ant and the receive terminal Rx. The circuit 50 including the longitudinally coupled acoustic wave filter 51 and the capacitors C1 and C2 are connected in parallel to the transmit filter 10.

Figure 16B:
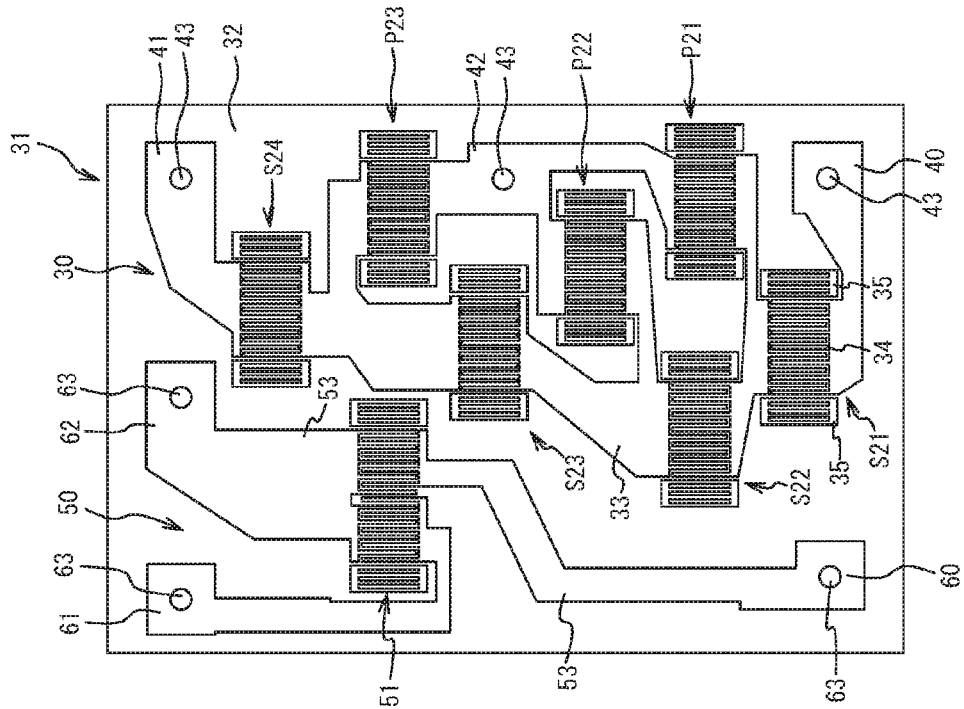
FIG. 16B is a top view of a chip including a receive filter of the duplexer of the fourth embodiment formed therein.
Figure 16A:
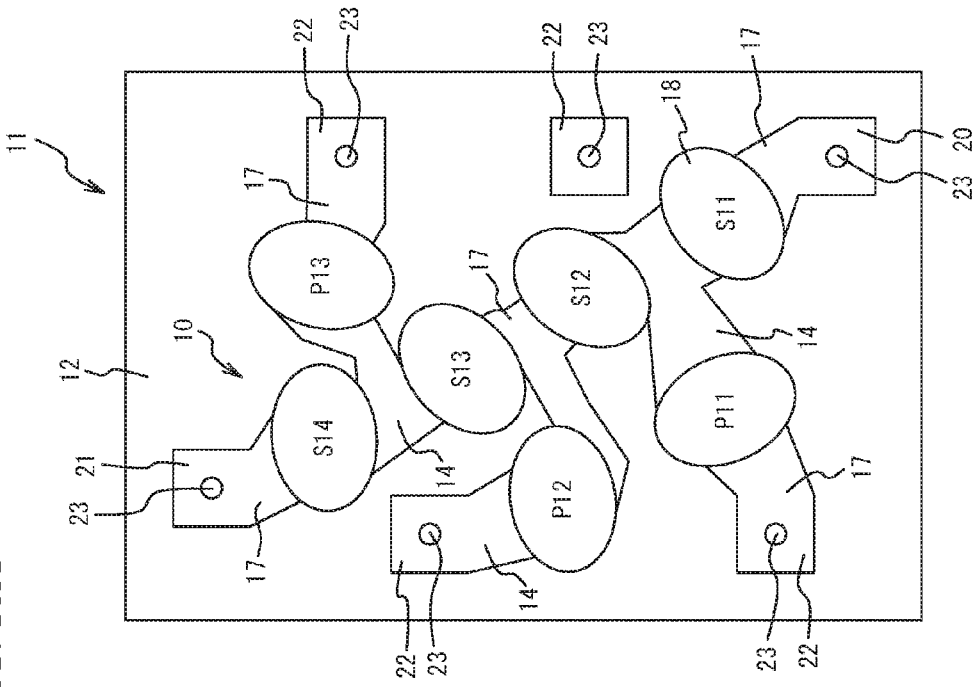
FIG. 16A is a top view of a chip including a transmit filter of a duplexer of a fourth embodiment formed therein.

FIG. 16A is a top view of the chip 11 including the transmit filter 10 of a duplexer of the fourth embodiment formed therein, and FIG. 16B is a top view of the chip 31 including the receive filter 30 of the duplexer of the fourth embodiment formed therein. As illustrated in FIG. 16A, the chip 11 including the transmit filter 10 of the duplexer of the fourth embodiment formed therein is the same as the chip of the first embodiment illustrated in FIG. 2A, and thus the description is omitted. In contrast, as illustrated in FIG. 16B, the chip 31 including the receive filter 30 of the duplexer of the fourth embodiment formed therein differs from the chip of the first embodiment illustrated in FIG. 3 in that the receive filter 30 and the longitudinally coupled acoustic wave filter 51 of the circuit 50 are formed but the capacitors C1 and C2 of the circuit 50 are not formed.

Figure 17A:
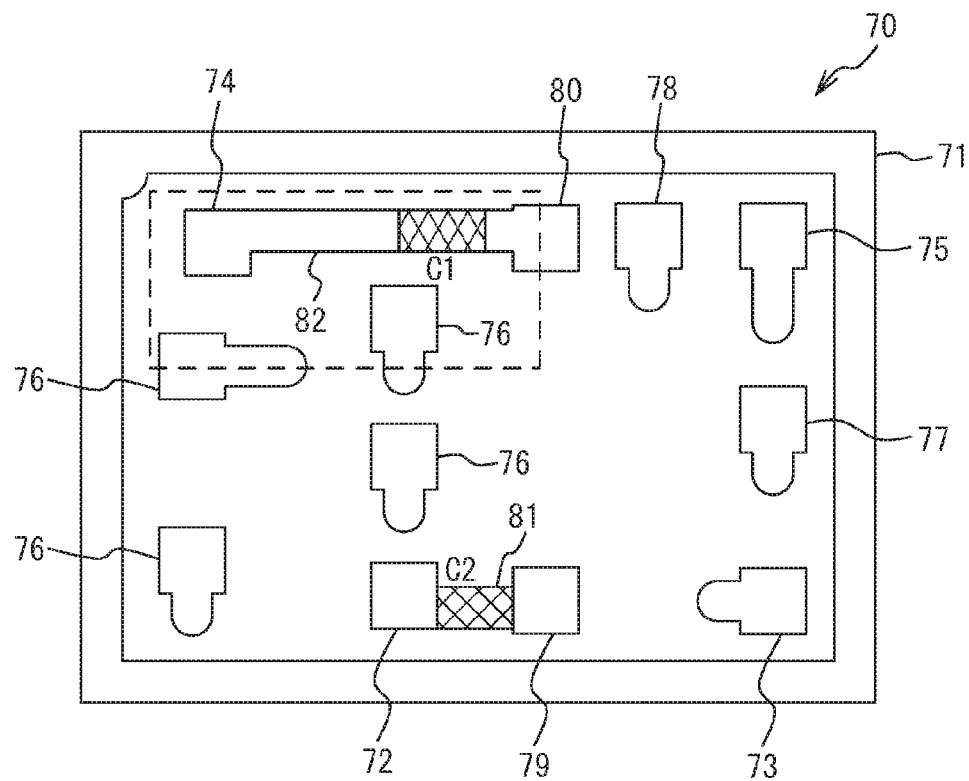
FIG. 17A is a top view of a die attach layer of a package substrate on which the chips are to be mounted.
Figure 17B:
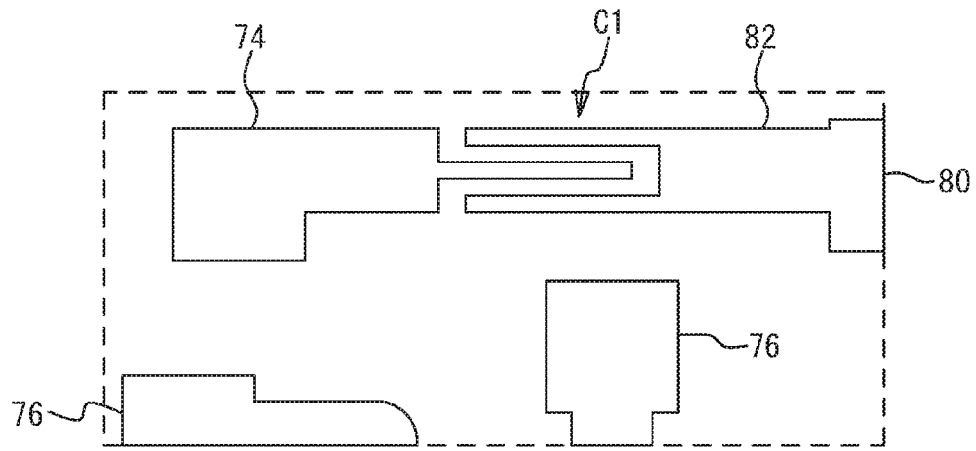
FIG. 17B is an enlarged view of the dashed line region in FIG. 17A.

FIG. 17A is a top view of the die attach layer 71 of the package substrate 70 on which the chips 11 and 31 are to be mounted, and FIG. 17B is an enlarged view of the dashed line region of FIG. 17A. As illustrated in FIG. 17A and FIG. 17B, the capacitor C2 is formed in the wiring line 81 connecting the connection pad 79 and the antenna pad 72, and the capacitor C1 is formed in the wiring line 82 connecting the connection pad 80 and the transmit pad 74. Each of the capacitors C1 and C2 is formed of, for example, a pair of comb-shaped electrodes. Other configurations are the same as those of the first embodiment, and thus the description thereof is omitted.

As in the fourth embodiment, the capacitors C1 and C2 of the circuit 50 may be located on the package substrate 70 on which the transmit filter 10 and the receive filter 30 are mounted. The fourth embodiment describes an exemplary case where the capacitors C1 and C2 are formed of comb-shaped electrodes, but does not intend to suggest any limitation. The capacitors C1 and C2 may be formed by sandwiching a layer (for example, a die attach layer) making up the package substrate 70 between a metal film formed on the upper surface of the layer and another metal film formed on the lower surface of the layer. The capacitors C1 and C2 may be formed by forming, on the die attach layer 71, a steric wiring structure in which a dielectric film is sandwiched between two wiring lines.

In the first through fourth embodiments, the transmit filter and/or the receive filter formed of piezoelectric thin film resonators is preferably a ladder-type filter. This is because it is difficult to adjust the resonant frequency of the resonator when the transmit filter and/or the receive filter formed of piezoelectric thin film resonators is, for example, a longitudinally coupled acoustic wave filter as described above. The transmit filter and/or the receive filter formed of surface acoustic wave resonators is not limited to a ladder-type filter, and may be a longitudinally coupled acoustic wave filter.

Fifth Embodiment

Figure 18:
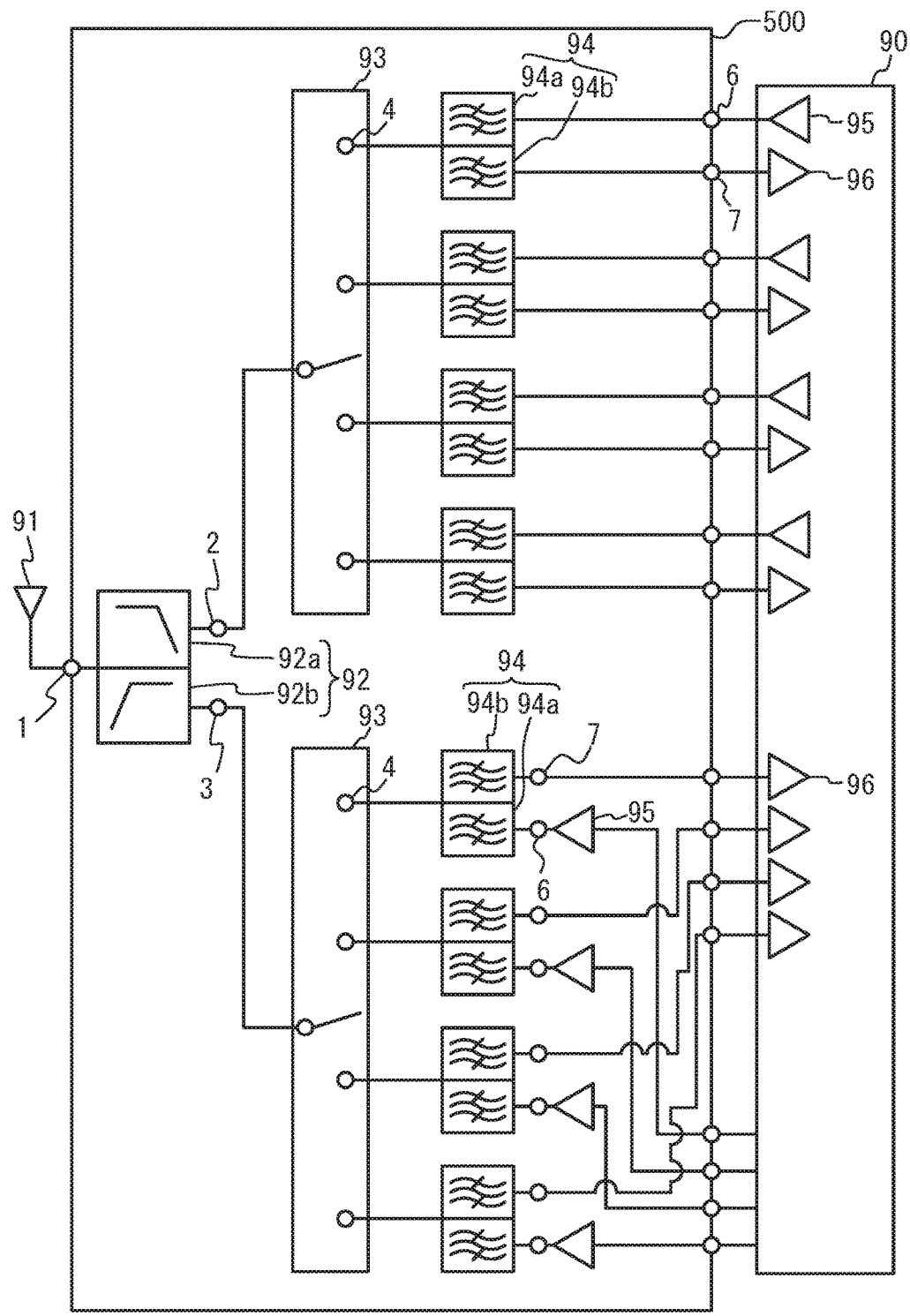
FIG. 18 illustrates a mobile communication device including a module in accordance with a fifth embodiment.

FIG. 18 illustrates a mobile communication device including a module 500 in accordance with a fifth embodiment. As illustrated in FIG. 18, the mobile communication device includes the module 500 that is a transceiver device, an integrated circuit 90, and an antenna 91. The module 500 includes a diplexer 92, switches 93, duplexers 94, and power amplifiers 95. The diplexer 92 includes a low-pass filter (LPF) 92a and a high-pass filter (HPF) 92b. The LPF 92a is connected between terminals 1 and 2. The HPF 92b is connected between terminals 1 and 3. The terminal 1 is connected to the antenna 91. The LPF 92a allows low-frequency signals of signals transmitted from/received by the antenna 91 to pass therethrough, and suppresses high-frequency signals. The HPF 92b allows high-frequency signals of signals transmitted from/received by the antenna 91 to pass therethrough, and suppresses low-frequency signals.

The switch 93 connects the terminals 2 and 3 to one of terminals 4. The duplexer 94 includes a transmit filter 94a and a receive filter 94b. The transmit filter 94a is connected between terminals 4 and 6. The receive filter 94b is connected between terminals 4 and 7. The transmit filter 94a allows signals within the transmit band to pass therethrough, and suppresses other signals. The receive filter 94b allows signals within the receive band to pass therethrough, and suppresses other signals. The power amplifier 95 amplifies and outputs transmission signals to the terminal 6. A low noise amplifier 96 amplifies reception signals output to the terminal 7.

The module 500 that is a transceiver device may employ any one of the duplexers described in the first through fourth embodiments as the duplexer 94. Instead of the duplexer, the quadplexer described in the third variation of the first embodiment may be used. The module 500 may include the power amplifier 95 and/or the low noise amplifier 96.

Although the embodiments of the present invention have been described in detail, it is to be understood that the various change, substitutions, and alterations could be made hereto without departing from the spirit and scope of the invention.

What is claimed is:

1. A multiplexer comprising:
   one or more transmit filters that are connected between an antenna terminal and one or more transmit terminals;
   one or more receive filters that are connected between the antenna terminal and one or more receive terminals; and
   a circuit that includes a longitudinally coupled acoustic wave filter and is connected in parallel to one or more series resonators of a first filter, the first filter being one of the one or more transmit filters and the one or more receive filters and including said one or more series resonators and one or more parallel resonators each formed of a piezoelectric thin film resonator,
   wherein the longitudinally coupled acoustic wave filter is formed of interdigital transducers (IDTs) that is formed on a chip of a second filter that is another one of the one or more transmit filters and the one or more receive filters and that is formed of one or more surface acoustic wave resonators, and
   wherein the circuit is not connected in parallel to the second filter.

2. The multiplexer according to claim 1, wherein
   a chip of the first filter and the chip of the second filter are mounted on a package substrate to be next to each other, and
   the circuit is connected in parallel to the one or more series resonators of the first filter through a wiring line located on the package substrate.

3. The multiplexer according to claim 1, wherein
   the circuit includes a capacitor connected in series to the longitudinally coupled acoustic wave filter at at least one of an input side and an output side of the longitudinally coupled acoustic wave filter, and
   the capacitor is formed of a comb-shaped electrode located on the chip of the second filter.

4. The multiplexer according to claim 1, wherein:
   the circuit includes a capacitor connected in series to the longitudinally coupled acoustic wave filter at at least one of an input side and an output side of the longitudinally coupled acoustic wave filter, and
   the capacitor has a structure in which a dielectric film is sandwiched between a lower wiring line and an upper wiring line.

5. The multiplexer according to claim 4, wherein
   the capacitor is located on the chip of the second filter, and
   the lower wiring line and the upper wiring line are made of a same material and have a same film thickness as the IDTs of the longitudinally coupled acoustic wave filter.

6. The multiplexer according to claim 4, wherein
   the capacitor is located on a chip of the first filter, and
   the lower wiring line, the dielectric film, and the upper wiring line are respectively made of a same material and respectively have a same film thickness as a lower electrode, a piezoelectric film, and an upper electrode of the piezoelectric thin film resonator.

7. The multiplexer according to claim 1, wherein
   the circuit includes a capacitor connected in series to the longitudinally coupled acoustic wave filter at at least one of an input side and an output side of the longitudinally coupled acoustic wave filter, and
   the capacitor is located on a package substrate on which the one or more transmit filters and the one or more receive filters are mounted.

8. The multiplexer according to claim 1, wherein
   the circuit is connected to a first node and a second node to be connected in parallel to the one or more series resonators of the first filter, and
   one of the IDTs of the longitudinally coupled acoustic wave filter is coupled to the first node, and another one of the IDTs of the longitudinally coupled acoustic wave filter is coupled to the second node.

9. A module comprising:
   a multiplexer comprising:
      one or more transmit filters that are connected between an antenna terminal and one or more transmit terminals;
      one or more receive filters that are connected between the antenna terminal and one or more receive terminals; and
      a circuit that includes a longitudinally coupled acoustic wave filter and is connected in parallel to one or more series resonators of a first filter, the first filter being one of the one or more transmit filters and the one or more receive filters and including said one or more series resonators and one or more parallel resonators each formed of a piezoelectric thin film resonator
      wherein the longitudinally coupled acoustic wave filter is formed of interdigital transducers (IDTs) formed on a chip of a second filter that is another one of the one or more transmit filters and the one or more receive filters and that is formed of one or more surface acoustic wave resonators, and
      wherein the circuit is not connected in parallel to the second filter.

10. A multiplexer comprising:
    one or more transmit filters that are connected between an antenna terminal and one or more transmit terminals;
    one or more receive filters that are connected between the antenna terminal and one or more receive terminals; and
    a circuit that includes a longitudinally coupled acoustic wave filter and is connected in parallel to one or more series resonators of a first filter, the first filter being one of the one or more transmit filters and the one or more receive filters and including said one or more series resonators and one or more parallel resonators each formed of a piezoelectric thin film resonator,
    wherein:
    the longitudinally coupled acoustic wave filter is formed of interdigital transducers (IDTs) formed on a chip of a second filter that is another one of the one or more transmit filters and the one or more receive filters and that is formed of one or more surface acoustic wave resonators,
    the circuit includes a capacitor connected in series to the longitudinally coupled acoustic wave filter at at least one of an input side and an output side of the longitudinally coupled acoustic wave filter, and the capacitor has a structure in which a dielectric film is sandwiched between a lower wiring line and an upper wiring line.

11. The multiplexer according to claim 10, wherein:
the capacitor is located on the chip of the second filter, and
the lower wiring line and the upper wiring line are made of a same material and have a same film thickness as the IDTs of the longitudinally coupled acoustic wave filter.

12. The multiplexer according to claim 10, wherein:
the capacitor is located on a chip of the first filter, and
the lower wiring line, the dielectric film, and the upper wiring line are respectively made of a same material and respectively have a same film thickness as a lower electrode, a piezoelectric film, and an upper electrode of the piezoelectric thin film resonator.

13. A multiplexer comprising:
one or more transmit filters that are connected between an antenna terminal and one or more transmit terminals;
one or more receive filters that are connected between the antenna terminal and one or more receive terminals; and
a circuit that includes a longitudinally coupled acoustic wave filter and is connected in parallel to one or more series resonators of a first filter, the first filter being one of the one or more transmit filters and the one or more receive filters and including said one or more series resonators and one or more parallel resonators each formed of a piezoelectric thin film resonator, wherein:
the longitudinally coupled acoustic wave filter is formed of interdigital transducers (IDTs) formed on a chip of a second filter that is another one of the one or more transmit filters and the one or more receive filters and that is formed of one or more surface acoustic wave resonators, the circuit includes a capacitor connected in series to the longitudinally coupled acoustic wave filter at at least one of an input side and an output side of the longitudinally coupled acoustic wave filter, and the capacitor is located on a package substrate on which the one or more transmit filters and the one or more receive filters are mounted.

* * * * *